US006489795B1

(12) United States Patent
Klele et al.

(10) Patent No.: US 6,489,795 B1
(45) Date of Patent: Dec. 3, 2002

(54) HIGH-FREQUENCY TEST PROBE ASSEMBLY FOR MICROCIRCUITS AND ASSOCIATED METHODS

(76) Inventors: Anthony G. Klele, 9328 Toby La., Orlando, FL (US) 32817; Seymour S. Lenz, Sr., 122 E. Lake Ave, Longwood, FL (US) 32750

( * ) Notice: Subject to any disclaimer, the term of this patent is extended or adjusted under 35 U.S.C. 154(b) by 0 days.

(21) Appl. No.: 09/861,237

(22) Filed: May 18, 2001

(51) Int. Cl.[7] ............................................. G01R 31/02
(52) U.S. Cl. ...................... 324/762; 324/754; 324/761
(58) Field of Search ........................... 324/754, 72.5, 324/762, 761, 421, 158.1, 722, 751, 757

(56) References Cited

U.S. PATENT DOCUMENTS

| | | | |
|---|---|---|---|
| 3,560,907 A | 2/1971 | Heller | 439/626 |
| 3,611,128 A | 10/1971 | Nagata | 324/72.5 |
| 3,702,439 A * | 11/1972 | McGahey et al. | 324/757 |
| 3,866,119 A | 2/1975 | Ardezzone et al. | 324/754 |
| 3,891,924 A | 6/1975 | Ardezzone et al. | 324/754 |
| 3,996,514 A | 12/1976 | Broen et al. | 324/722 |
| 4,045,737 A | 8/1977 | Coberly | 324/754 |
| 4,151,465 A | 4/1979 | Lenz | 324/754 |
| 4,177,425 A | 12/1979 | Lenz | 324/754 |
| 4,480,223 A * | 10/1984 | Aigo | 324/762 |
| 4,618,821 A | 10/1986 | Lenz | 324/754 |
| 4,727,319 A * | 2/1988 | Shahriary | 324/754 |
| 4,749,941 A * | 6/1988 | Sang et al. | 324/762 |
| 4,783,625 A * | 11/1988 | Harry et al. | 324/72.5 |
| 4,965,865 A | 10/1990 | Lenz | 324/754 |
| 4,973,903 A | 11/1990 | Schemmel | 324/754 |
| 5,221,895 A * | 6/1993 | Janko et al. | 324/762 |
| 5,307,012 A * | 4/1994 | Bhattacharyya et al. | 324/762 |
| 5,506,515 A * | 4/1996 | Godshalk et al. | 324/762 |
| 5,621,333 A * | 4/1997 | Long et al. | 324/762 |
| 5,720,098 A | 2/1998 | Kister | 29/825 |
| 5,883,519 A | 3/1999 | Kennedy | 324/761 |
| 6,034,533 A * | 3/2000 | Tervo et al. | 324/762 |
| 6,249,133 B1 * | 4/2000 | Schwindt | 324/762 |
| 6,075,376 A * | 6/2000 | Schwindt | 324/762 |
| 6,118,287 A * | 9/2000 | Boll et al. | 324/754 |
| 6,384,615 B2 * | 3/2001 | Schwindt | 324/754 |
| 6,040,704 A1 * | 4/2001 | Kondo et al. | 324/762 |
| 6,211,690 B1 * | 4/2001 | Fjelstad | 324/761 |
| 6,229,327 B1 * | 5/2001 | Boll et al. | 324/762 |
| 6,232,789 B1 * | 5/2001 | Schwindt | 324/754 |
| 6,310,483 B1 * | 10/2001 | Taura et al. | 324/754 |

* cited by examiner

*Primary Examiner*—N. Le
*Assistant Examiner*—Wasseem H. Hamdan

(57) ABSTRACT

A test probe for microcircuits includes a unitary elongated electrically conductive arm. A rear end portion is for connecting to a test circuit; a front end portion is for contacting a circuit to be tested and has an upwardly extending tip. A rear central portion is positioned adjacent the rear end portion, and a front central portion between the rear central portion and the front end portion, which has a slot extending between the side surfaces. Typically the test probe is sandwiched in spaced relation between two ground probes having rear portions for connecting to ground, which are movably affixed to a retaining block having slots for holding the probes. The configuration of the signal probe, the probe slot, and the ground probe is dependent upon the spacing between the probes, the retainer block material, the frequency of the signal, and the impedance.

11 Claims, 4 Drawing Sheets

HIGH-FREQUENCY TEST PROBE ASSEMBLY FOR MICROCIRCUITS AND ASSOCIATED METHODS

BACKGROUND OF THE INVENTION

1. Field of the Invention

The present invention relates to circuit testing devices and methods and, more particularly, to such devices and methods for radio-frequency circuits.

2. Description of Related Art

Test probes for use in testing electronic circuitry are known in the art to comprise one or more elongated arms having a downwardly depending, typically pointed, electrically conductive distal tip for contacting a portion of the circuit. One of the inventors of the present application has disclosed test probes and assemblies in U.S. Pat. Nos. 4,151,465; 4,177,425; and 4,618,821, the contents of which are incorporated herein by reference.

It is known to be preferable for the probe arm to have a certain amount of flexibility for permitting reproducible and nondamaging contact with the circuit. Exemplary flexure means are disclosed in the '465 and '821 patents. Other such probes are disclosed in U.S. Pat. Nos. 4,973,903; 4,965,865; 5,720,098; and 5,883,519.

SUMMARY OF THE INVENTION

It is therefore an object of the present invention to provide a probe for testing circuits having improved flexibility.

It is a further object to provide such a probe having a longer lifespan and durability.

It is another object to provide such a probe having a tunable bandpass.

It is an additional object to provide such a probe having a controllable impedance.

It is also an object to provide such a probe that functions in the gigahertz rf range.

It is yet a further object to provide a method of making such a probe.

It is yet another object to provide a method of using such a probe.

These and other objects are achieved by the present invention a test probe for testing microcircuits. The test probe comprises a unitary elongated electrically conductive arm member that is movably affixable to a retaining block. The test probe has a pair of generally planar and parallel side surfaces extending along a longitudinal axis. A rear end portion is for connecting to a test circuit, and a front end portion is for contacting a circuit to be tested and comprises an upwardly extending tip.

A rear central portion is positioned adjacent the rear end portion, with the front central portion between the rear central portion and the front end portion. The front central portion has a slot extending through the arm between the side surfaces.

Typically the test probe is sandwiched in spaced relation between two similarly constructed ground probes, these having rear portions for connecting to ground. These three probes are movably affixed to a retaining block having slots therein for holding the probes.

It should be emphasized that the present invention has great adaptability for different situations. For example, the assembly may have one or more contact points depending upon the application. The assembly may also be configured as a probe where it is moved from contact point to contact point, such as for use as a semiconductor wafer probe. It may additionally be configured as a socket where multiple contact points are arranged in a pattern and a device is inserted or placed onto the contact points.

A particular benefit of the present invention lies in its multiplicity of degrees of freedom, including selectable impedance, selectable contact spacing, selectable overtravel, selectable contact pressure, and selectable frequency response.

Most probes that are currently available are designed for a characteristic impedance of 50Ω, with 75-Ω probes also available. With the present invention, a range of impedances is achievable as a function of geometry, by adjusting the shape of the contact and the proximity of the adjacent ground contact or reflecting structure in concert with the dielectric between them controlling the impedance.

In addition, the contact spacing is adjustable for each application.

Overtravel is the ability for the contact(s) to be moved beyond an initial point of contact with a device. The type, thickness, and shape of material used for the contact controls overtravel. It is believed desirable to have an abundance of overtravel and strict control of it because: (1) Overtravel provides the ability to planarize an array of contact and eliminates the need for ultraprecise orthogonal relationships between each contact and between the contact array and the device to be tested; and (2) the shape of the contact and overtravel creates a torsion component that controls the contact pressure applied to the device being tested.

The probe assembly of the present invention is designed for very wide frequency response, from dc to hundreds of gigahertz ($10^{10}$ Hz). The response can also be tailored to fit the requirements of a given application by limiting the high-, low-, or mid-frequency response by changing the shape, dielectric material, and contact-to-contact proximity.

The spacing, impedance, overtravel, and frequency requirements of the application dictate the materials used and the final shape of the contact or contact array. The contact is designed iteratively, with an initial shape selected to fit the physical spacing, overtravel, and pressure constraints. A dielectric is chosen based on the shape selected to obtain an impedance close to the design requirements. Multiple dielectrics may be required to maintain the desired impedance from end to end of the contact. Mathematical simulations are performed and the results evaluated. Adjustments may be made as needed to optimize the response, and simulations run again if necessary until a desired simulation is achieved. The resulting design is manufactured and tested and redesigned if the simulated and actual results are not comparable to a desired degree.

The features that characterize the invention, both as to organization and method of operation, together with further objects and advantages thereof, will be better understood from the following description used in conjunction with the accompanying drawing. It is to be expressly understood that the drawing is for the purpose of illustration and description and is not intended as a definition of the limits of the invention. These and other objects attained, and advantages offered, by the present invention will become more fully apparent as the description that now follows is read in conjunction with the accompanying drawing.

DETAILED DESCRIPTION OF THE PREFERRED EMBODIMENTS

Figure 1:
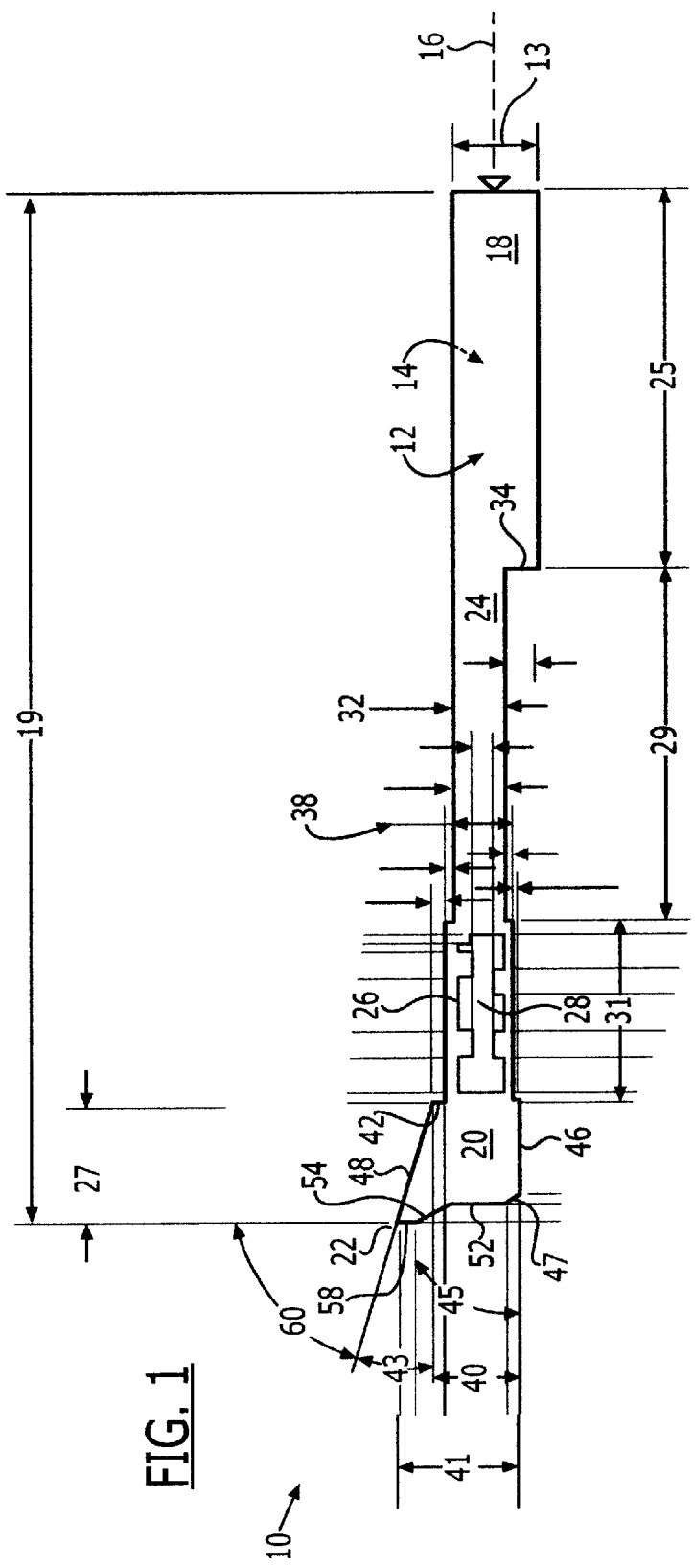
FIG. 1 is a side view of a signal probe of the present invention.
Figure 2:
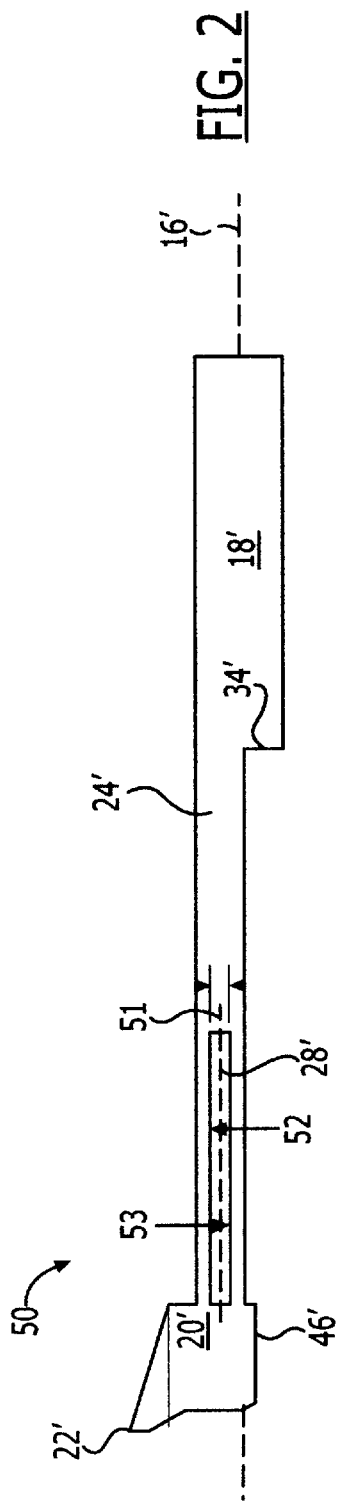
FIG. 2 is a side view of a ground probe.
Figure 3:
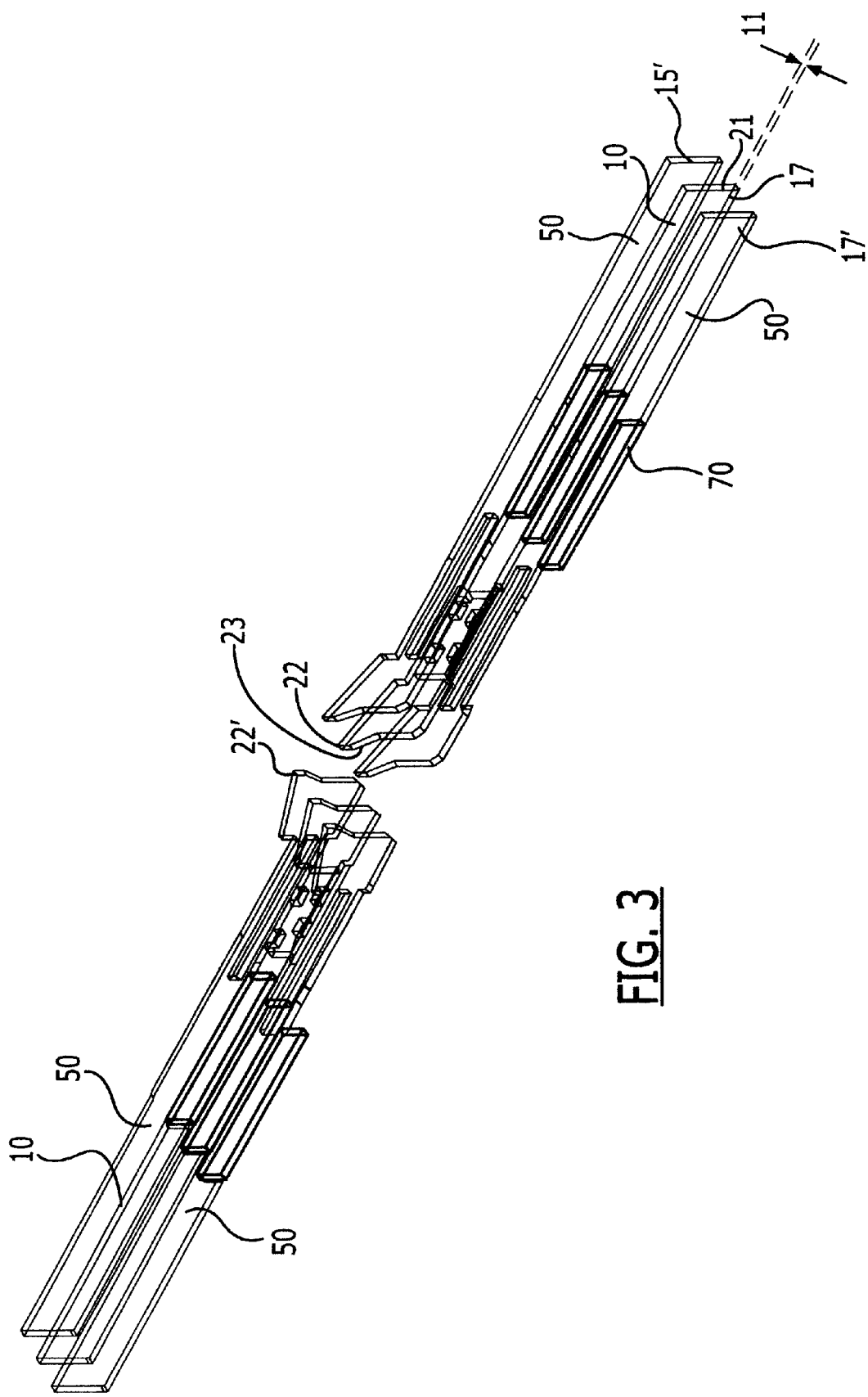
FIG. 3 is a rear-side perspective view of two sets of ground and signal probes.

A description of the preferred embodiments of the present invention will now be presented with reference to FIGS. 1–7. The test probe 10, shown in side view in FIG. 1, comprises a unitary elongated electrically conductive arm that has a pair of generally planar and parallel side surfaces 12,14 that extend along a longitudinal axis 16. Preferably the arm 10 has a generally constant width 11 (FIG. 3) between the side surfaces 12,14 and a first height 13 between a top 15 and a bottom 17 surface along a rear end portion 18. The width 11 is substantially smaller than the first height 13. In an exemplary embodiment a width between the side surfaces is approximately 0.01 in., and a length 19 between a rear edge 21 and the front edge 23 is approximately 1.0 in.

The rear end portion 18 is for connecting to a test circuit, and a front end portion 20 is for contacting a circuit to be tested. The rear end portion 18 is a substantially rectangular section having a first length 25. The front end portion 20 includes an upwardly extending tip 22 and has a second length 27.

Between the front 20 and rear 18 end portions extend rear-24 and front-central 26 portions having third 29 and fourth 31 lengths, respectively. The rear-central portion 24 is adjacent the rear end portion 18. The front-central portion 26 extends between the rearcentral portion 24 and the front end portion 20.

Figure 4:
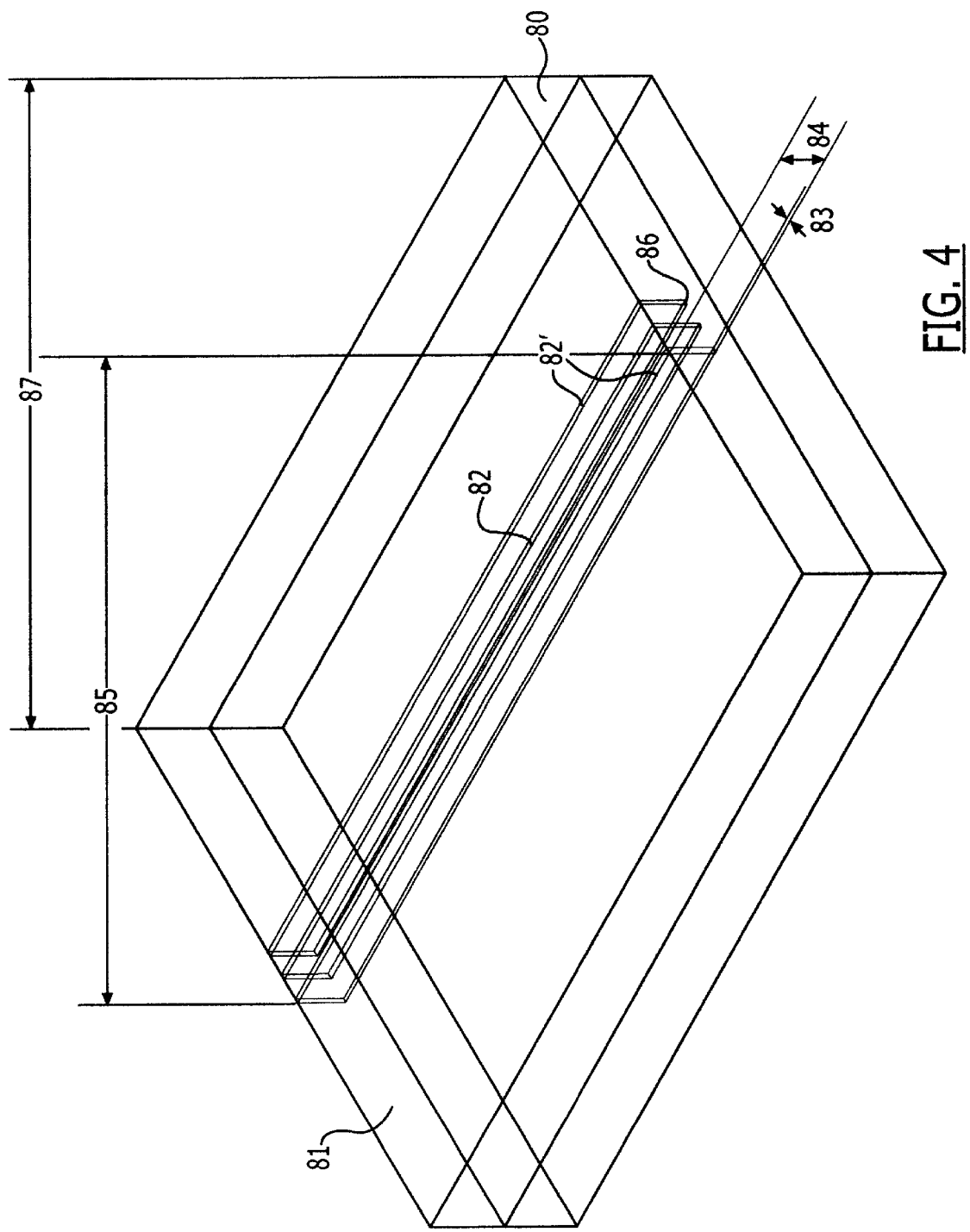
FIG. 4 is top-side view of a slotted block for mounting the probes.
Figure 5:
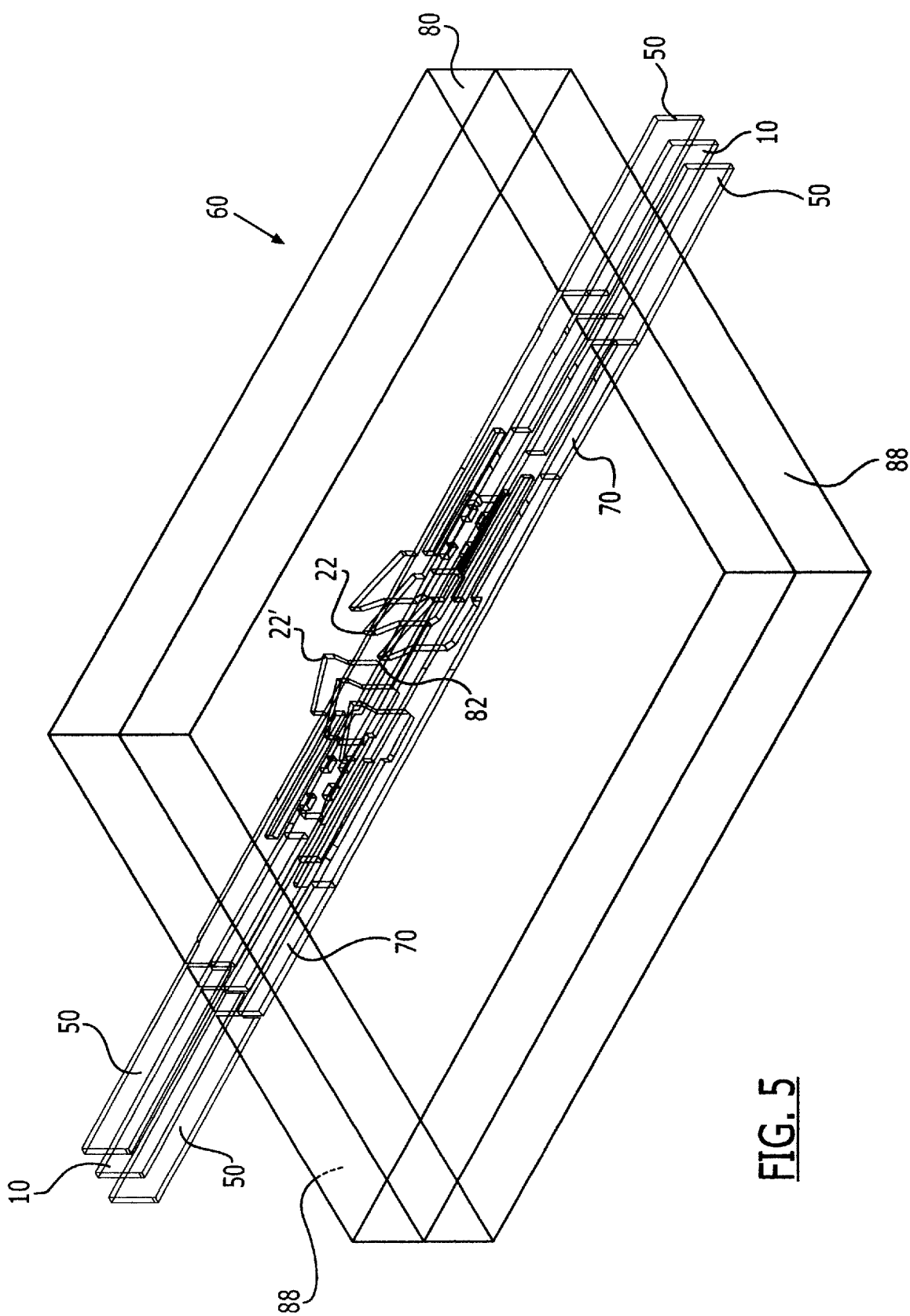
FIG. 5 is a top-side view of the probe assembly.

The rear-central portion 24 has a first height 32. The rear end portion 18 has a second height 13 that is greater than the first height 32. The rear-central portion 24 and the rear end portion 18 meet at a downwardly projecting rear step 34 therebetween. The rear step 34 serves as a stop for the probe-tip registration to the circuit pad. The downward-protruding step in the probe allows the blade probe the slide into the slot until the step reaches the shim spacer, or, in an alternate embodiment, an edge of the retaining block (FIG. 4). At least a section of the rear- 24 and the front-central 26 portions and the front end portion 20 are dimensioned to fit within the block slot 82, with the rear end portion 18 extending out of the block slot 82.

The first height 32 is smaller than a third height 38 of the front-central portion 26. The front end portion 20 has a variable height, even the minimum of which, fourth height 40, is greater than the third height 38 and therefore the maximum height 41 of the front end portion 20 is also greater than the third height 38.

The front end portion 20 meets the front-central portion 26 at a top upwardly extending step 42 and a bottom downwardly extending step 44. A bottom edge 46 is generally parallel to the longitudinal axis 16. A top edge 48 slopes upward away from the top step 42 at an angle 43 and ends at the tip 22. A bottom section 50 of a front edge 52 extends upward generally perpendicular to the bottom edge 46 following a short outwardly angled 45 section 47, and a center section 54 of the front edge 52 meets the bottom section 50 at the same angle as 45 and slopes upward and forward. A top section 58 of the front edge 52 meets the center section 54 and is generally perpendicular to the bottom edge 46 to meet the tip 22 and at acute angle 60.

The front-central portion 26 has an irregularly shaped slot 28 extending through the arm 10 between the side surfaces 12,14. The hole 28 permits flexure in the arm 10 in the plane of the side surfaces 12,14 and also defines an impedance thereof. The hole 28 in an exemplary embodiment comprises a plurality of interconnected generally rectangular subholes 30. The size and shape of the subholes 30 is selectable and can be modeled to provide a desired impedance and flexure. It is not necessary that the subholes comprise rectangles; these were selected for ease of modeling, and one of skill in the art will recognize that alternate shapes of the hole 28 may be utilized to obtain a desired set of characteristics.

The ground probe 50 of the present invention (FIG. 2) is formed substantially identically to the test probe 10 in all but the hole, which comprises a generally rectangular elongated slot 28' for conferring flexibility to the arm 50. The slot 28' has a long axis 51 extending generally parallel to the longitudinal axis 16' of the ground probe 50. The slot 28' also has top 52 and bottom 53 edges generally parallel to a top edge 54 of the front central portion 26'. In use the test probe 10 is positioned between two ground probes 50 (FIGS. 3 and 5), all side surfaces 15,17,15',17' thereof generally parallel to each other and the tips 22,22' approximately coplanar.

In an exemplary embodiment the arms 10,50 comprise a nonconductive material coated with a conductive material. In a preferred embodiment the nonconductive material comprises a plastic material and the conductive material comprises a metal. In a most preferred embodiment the plastic material comprises Teflon and the metal comprises phosphor bronze.

A test probe assembly 60 (FIG. 5) comprises an electrically insulating retaining block 80 (FIG. 4) that has a plurality of block slots 82,82' in a top surface 81 thereof. Each of these slots 82,82' has a width 83, a depth 84, and a length 85. The width 83 is larger than the probe width 11 to permit the probes 10,50 to reside partially therewithin. The length 85 in this embodiment equals the length 87 of the block 80 and is sufficient to permit two probes 10,50 to reside partially therewithin with the rear end portions 18,18' protruding therefrom, with space between the facing tips 22,22'.

The width 83 and the depth 84 of the block slots 82,82' are sufficient to admit a shim spacer 70 therein (FIGS. 3 and 5), which is pressed into each slot 82,82' flush to the edge 88 of the retainer block 80.

The depth 84 is further sufficient to admit the rear-central portions 24,24' and to maintain the bottom edges 46,46' of the front end portions 20,20' in spaced relation from a bottom 86 of the block slot 82,82'. In addition, the shim spacers 70 lift each probe 10,50 so that the probe tips 22,22' have room to flex downwards. In an alternate embodiment, the shim 70 is eliminated by cutting the block slots 82,82' so as to mimic the presence of the shim 70. This positioning permits flexure of the arms 10,50 into the slot to meet a point on a circuit to be tested and achieve contact by a plurality of tips 22,22' substantially simultaneously without damaging the circuit. This is important in achieving reproducible contact and in compensating for possible nonplanarities in the tips 22,22' and the touch points on the circuit.

Since the arms 10,50 comprise unitary members, the flexure provided by the holes 28,28' confers exceptional ruggedness since the tips 22,22' self-planarize and the arms 10,50 spring back to a "rest" orientation to which they are biased. Known prior art test probes are known to last from 75,000 to 200,000 insertions before requiring replacement;

the present test probes 10 will endure a minimum of many hundreds of thousands and up to 1 million insertions. Further, the flexibility of the present probes 10,50 to achieve a desired overtravel is adjustable, and can extend from approximately 10 μm to 500 μm.

Two test probes 10 are partially positioned within the central slot 82, in facing relation to each other, tips 22 in spaced relation at the approximate center of the block 80. Four ground probes 50 are partially positioned pairwise in each outer slot 82', tips 22' facing as with the test probes 10. Each probe 10,50 has the step 34,34' serving as a stop to prevent the rear end portions 18,18' from entering a slot 82,82'

An outer block 86 comprising an electrically conductive material such as brass, or an insulator such as Teflon, surrounds the retaining block 80, which may comprise a thermoplastic material such as Teflon.

In the foregoing description, certain terms have been used for brevity, clarity, and understanding, but no unnecessary limitations are to be implied therefrom beyond the requirements of the prior art, because such words are used for description purposes herein and are intended to be broadly construed. Moreover, the embodiments of the apparatus illustrated and described herein are by way of example, and the scope of the invention is not limited to the exact details of construction.

Alternate embodiments may be envisaged by one of skill in the art, for example, a configuration having a plurality of rf signal probes, interspersed with ground probes on each side. One to four sides of a microcircuit chip may be probed simultaneously in another embodiment.

Further, these probes as disclosed may be used to fabricate a probe card instead of a socket. Such a probe card uses a similar retainer block with slots cut therein, but is configured to have the probe tips facing down instead of up. The retainer block has four mounting holes to allow the block to be screw mounted to the bottom of a standard probe card. When the block probe card assembly is inserted into a probe station or laser trimmer, the substrate is brought into contact with the probes for testing or laser trimming of the part.

Having now described the invention, the construction, the operation and use of preferred embodiment thereof, and the advantageous new and useful results obtained thereby, the new and useful constructions, and reasonable mechanical equivalents thereof obvious to those skilled in the art, are set forth in the appended claims.

What is claimed is:

1. A test and ground probe assembly comprising:
   a test probe comprising a unitary elongated electrically conductive arm member movably affixable to a retaining block and having:
      a pair of generally planar and parallel side surfaces extending along a longitudinal axis;
      a rear end portion for connecting to a test circuit;
      a front end portion for contacting a circuit to be tested comprising an upwardly extending tip; and
      a rear- and a front-central portion, the rear central portion adjacent the rear end portion, the front central portion between the rear central portion and the front end portion, the front central portion having a hole extending through the arm member between the side surfaces; and
   a pair of ground probes, each comprising a unitary elongated electrically conductive arm member, each movably affixable to a retaining block and having:
      a pair of generally planar and parallel side surfaces extending along a longitudinal axis;
      a rear end portion for connecting to ground;
      a front end portion for contacting a circuit to be tested comprising an upwardly extending tip;
      a rear- and a front-central portion, the rear central portion adjacent the rear end portion, the front central portion between the rear central portion and the front end portion, the front central portion having a hole extending through the arm member between the side surfaces;
   wherein the test probe is positioned between the ground probes, all side surfaces thereof generally parallel to each other and the tips approximately coplanar.

2. The test and ground probe assembly recited in claim 1, wherein the ground probe hole comprises an elongated slot having a long axis extending generally parallel to the longitudinal axis of the ground probe.

3. The test and ground probe assembly recited in claim 2, wherein the slot has top and bottom edges generally parallel to a top edge of the front central portion.

4. The test and ground probe assembly recited in claim 1, wherein the rear central portions of the test probe and the ground probes each have a first height and the rear end portions of the test probe and the ground probes each have a second height greater than the first height, the rear central regions and the rear end portions each meeting at a downwardly projecting rear step therebetween.

5. The test and ground probe assembly recited in claim 4, wherein the rear steps are for serving as a registration stop against an outer edge of the retaining block, at least a section of the rear and the front central portions and the front end portions dimensioned to fit within a slot in the retaining block, the rear end portions extending out of the retaining block slot.

6. A test probe assembly comprising:
   an electrically insulating retaining block having a slot in a top surface thereof, the slot having a width, a depth, and a length; and
   a test probe partially positioned within the block slot, comprising a unitary elongated electrically conductive arm member and having:
      a pair of generally planar and parallel side surfaces extending along a longitudinal axis, a width between the side surfaces smaller than the block slot width;
      a rear end portion for connecting to a test circuit;
      a front end portion for contacting a circuit to be tested comprising an upwardly extending tip and having a height greater than the block slot depth;
      a rear- and a front-central portion, the rear-central portion adjacent the rear end portion, the front central portion between the rear central portion and the front end portion, the front central portion having a slot extending between the side surfaces; and
      a length from a front edge to a section where the rear- and front central portions meet smaller than the block slot length;
   the block slot comprises three generally parallel block slots, and further comprising a pair of ground probes, each comprising a unitary elongated electrically conductive arm member, the test probe partially positioned within a center block slot and one ground probe partially positioned in each outer block slot and having:
      a pair of generally planar and parallel side surfaces extending along a longitudinal axis and having a width between the side surfaces smaller than the block slot width;
      a rear end portion for connecting to ground;
      a front end portion for contacting a circuit to be tested comprising an upwardly extending tip and having a height greater than the block slot depth, a rear- and a front-central portion, the rear central portion adjacent the rear end portion, the front central portion between the rear central portion and the front end portion, the front central portion having a hole extending between the side surfaces; and a length from a front edge to a section where the rear- and front-central portions meet smaller than the block slot length.

7. The test probe assembly recited in claim 6, further comprising a shim positioned within the block slot beneath the rear-central portion for lifting the probe tip to provide downward-flexing travel.

8. The test probe assembly recited in claim 6, further comprising an outer block having a well in a top surface thereof, the well dimensioned to hold the retaining block, the top surface generally coplanar with the top surface of the retaining block.

9. The test probe assembly recited in claim 8, wherein the outer block comprises one of an electrically conductive material or a thermoplastic material.

10. The test probe assembly recited in claim 8, wherein the outer block comprises one of brass or a thermoplastic material.

11. A method of testing a microcircuit comprising the steps of:

providing a test probe comprising a unitary elongated electrically conductive arm member movably affixable to a retaining block and having:

a pair of generally planar and parallel side surfaces extending along a longitudinal axis;

a rear end portion for connecting to a test circuit;

a front end portion for contacting a circuit to be tested comprising an upwardly extending tip; and a rear- and a front-central portion, the rear central portion adjacent the rear end portion, the front central portion between the rear central portion and the front end portion, the front central portion having a hole extending through the arm between the side surfaces;

connecting the rear end portion of the test probe to a test circuit;

contacting the test probe tip to a portion of a circuit to be tested; and performing a measurement based on a signal transmitted from the tip to the test circuit.

\* \* \* \* \*